(12) United States Patent
Yamashita et al.

(10) Patent No.: US 12,394,541 B2
(45) Date of Patent: Aug. 19, 2025

(54) SUPERCONDUCTING WIRE MATERIAL, SUPERCONDUCTING COIL, SUPERCONDUCTING MAGNET, SUPERCONDUCTING MOTOR, SUPERCONDUCTING GENERATOR, SUPERCONDUCTING AIRCRAFT, AND SUPERCONDUCTING DEVICE

(71) Applicant: KABUSHIKI KAISHA TOSHIBA, Tokyo (JP)

(72) Inventors: Tomohiro Yamashita, Minato Tokyo (JP); Hirotaka Ishii, Shinagawa Tokyo (JP); Tomoko Eguchi, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 209 days.

(21) Appl. No.: 18/459,725

(22) Filed: Sep. 1, 2023

(65) Prior Publication Data

US 2024/0321485 A1    Sep. 26, 2024

(30) Foreign Application Priority Data

Mar. 22, 2023 (JP) .................................. 2023-046067

(51) Int. Cl.
*H01B 12/00* (2006.01)
*C04B 35/45* (2006.01)
(Continued)

(52) U.S. Cl.
CPC ......... *H01B 12/06* (2013.01); *C04B 35/4504* (2013.01); *C04B 2235/3282* (2013.01); *H01F 6/06* (2013.01); *H02K 55/00* (2013.01)

(58) Field of Classification Search
CPC ................ H01B 12/06; C04B 35/4504; C04B 2235/3282; H01F 6/06; H02K 55/00
See application file for complete search history.

(56) References Cited

U.S. PATENT DOCUMENTS

| 10,541,073 B2 | 1/2020 | Araki et al. |
| 10,916,361 B2 | 2/2021 | Hayashi et al. |

(Continued)

FOREIGN PATENT DOCUMENTS

| JP | 2012-33402 A | 2/2012 |
| JP | 2018-41715 A | 3/2018 |

(Continued)

OTHER PUBLICATIONS

Japan Patent Office, Decision to Grant a Patent in JP App. No. 2023-046067 (Jul. 8, 2025).

*Primary Examiner* — Pete T Lee
(74) *Attorney, Agent, or Firm* — Finnegan, Henderson, Farabow, Garrett & Dunner, LLP

(57) ABSTRACT

A superconducting wire according to an embodiment includes: a substrate; a first region provided on the substrate and containing a first rare earth element, Ba, Cu, and O; a second region provided on the substrate and containing a second rare earth element, Ba, Cu, and O; and a third region provided on the substrate, provided between the first region and the second region, and containing a third rare earth element, Pr, Ba, Cu, and O. A surface density of particles having an aspect ratio of 3 or more present on a surface of the third region is larger than a surface density of particles having an aspect ratio of 3 or more present on surfaces of the first region and the second region.

14 Claims, 10 Drawing Sheets

(51) Int. Cl.
*H01B 12/06* (2006.01)
*H01F 6/06* (2006.01)
*H02K 55/00* (2006.01)

(56) References Cited

U.S. PATENT DOCUMENTS

| | | | |
|---|---|---|---|
| 2007/0111893 A1* | 5/2007 | Kodenkandath | H01P 1/203 |
| | | | 257/E39.018 |
| 2012/0028808 A1 | 2/2012 | Kaneko et al. | |
| 2015/0228379 A1* | 8/2015 | Yoo | H10N 60/857 |
| | | | 264/234 |
| 2015/0262734 A1* | 9/2015 | Nakayama | H10N 60/0632 |
| | | | 428/697 |
| 2022/0085269 A1 | 3/2022 | Araki et al. | |
| 2022/0085270 A1 | 3/2022 | Araki et al. | |

FOREIGN PATENT DOCUMENTS

| | | |
|---|---|---|
| JP | 2020-74284 A | 5/2020 |
| JP | 2022-48873 A | 3/2022 |
| JP | 2022-48874 A | 3/2022 |
| WO | WO 2017/145401 A1 | 8/2017 |

\* cited by examiner

SUPERCONDUCTING WIRE MATERIAL, SUPERCONDUCTING COIL, SUPERCONDUCTING MAGNET, SUPERCONDUCTING MOTOR, SUPERCONDUCTING GENERATOR, SUPERCONDUCTING AIRCRAFT, AND SUPERCONDUCTING DEVICE

CROSS-REFERENCE TO RELATED APPLICATION

This application is based upon and claims the benefit of priority from Japanese Patent Application No. 2023-046067, filed on Mar. 22, 2023, the entire contents of which are incorporated herein by reference.

FIELD

Embodiments described herein relate generally to a superconducting wire, a superconducting coil, a superconducting magnet, a superconducting motor, a superconducting generator, a superconducting aircraft, and a superconducting device.

BACKGROUND

For example, in a case where a superconducting coil using a superconducting wire is applied to a motor, in order to change a magnetic field generated in the superconducting coil, an alternating current in which a direction of a current is reversed flows through the superconducting wire constituting the superconducting coil. The use of the superconducting wire through which the alternating current flows is referred to as a superconducting alternating current application.

In the superconducting alternating current application, an energy loss occurs due to an inductance component of the superconducting wire. The energy loss due to the inductance component of the superconducting wire is also referred to as an alternating current loss. In the superconducting alternating current application, it is desirable to reduce the alternating current loss of the superconducting wire.

In the following description, an application in which the current is changed without being inverted and the inductance component becomes a problem is also referred to as an alternating current application.

DETAILED DESCRIPTION

Figure 1:
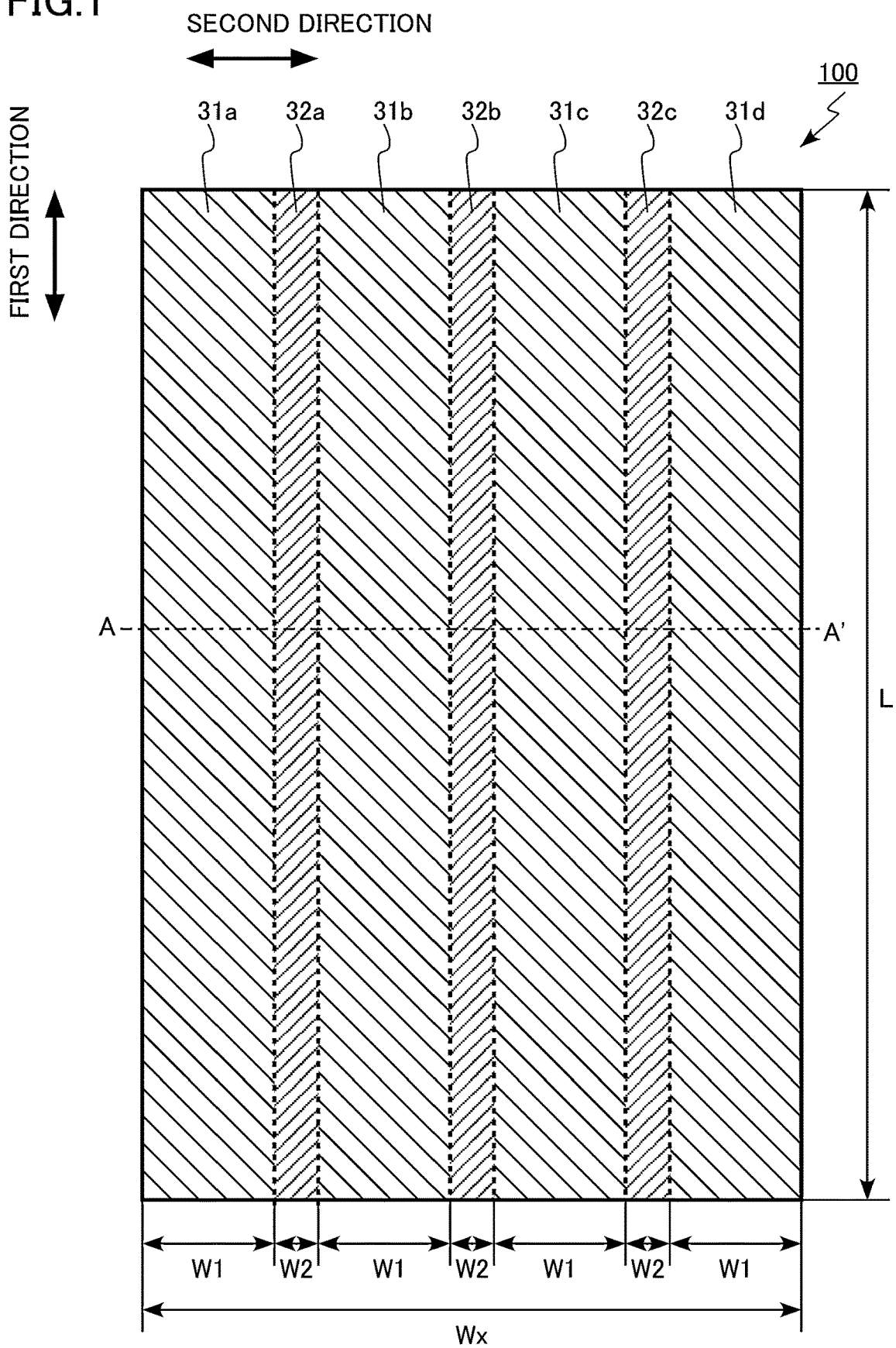
FIG. 1 is a schematic top view of a superconducting wire according to a first embodiment.

A superconducting wire according to an embodiment includes: a substrate; a first region provided on the substrate, the first region containing barium (Ba), copper (Cu), oxygen (O), and at least one first rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), and the first region extending in a first direction along a surface of the substrate; a second region provided on the substrate, the second region containing barium (Ba), copper (Cu), oxygen (O), at least one second rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), and the second region extending in the first direction; and a third region provided on the substrate, the third region being provided so as to be in contact with the first region and the second region between the first region and the second region, the third region containing praseodymium (Pr), barium (Ba), copper (Cu), oxygen (O), and at least one third rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), and the third region extending in the first direction. A surface density of particles having an aspect ratio of 3 or more present on a surface of the third region is larger than a surface density of particles having an aspect ratio of 3 or more present on a surface of the first region, and the surface density of the particles having an aspect ratio of 3 or more present on the surface of the third region is larger than a surface density of particles having an aspect ratio of 3 or more present on a surface of the second region.

Qualitative analysis and quantitative analysis of the chemical composition of members constituting the superconducting wire in the present specification can be performed by, for example, secondary ion mass spectroscopy (SIMS) or an electron probe micro analyzer (EPMA). In addition, for example, a transmission electron microscope (TEM) or a scanning electron microscope (SEM) can be used for measuring the width of the member constituting the superconducting wire, the thickness of the member, the distance between the members, and the like, and identifying the continuity of the crystal structure. In addition, for example, X-ray diffraction (XRD) can be used for identifying a constituent material of the member constituting the superconducting wire and identifying orientation of crystal axes.

The "aspect ratio of particles" contained in the superconducting wire in the present specification is defined as follows. When particles determined from a two-dimensional image obtained by imaging the superconducting wire are fitted with an ellipse, a length of a long axis is defined as a long diameter, and a length of a short axis is defined as a short diameter. A ratio of the long diameter to the short diameter (long diameter/short diameter) is defined as the aspect ratio of the particles. For example, a shape of the particle is determined by performing image processing on an SEM image of the superconducting wire, and the "aspect ratio of the particle" can be obtained from the determined shape of the particle.

The SEM image of the superconducting wire is analyzed using, for example, image processing software ImageJ. Particles having a high aspect ratio in the SEM image are extracted as bright regions. The extraction is performed by binarization of the SEM image. A threshold of the binarization is set such that the original SEM image is compared with the SEM image after the binarization, and particles having a high aspect ratio are appropriately extracted. When adjacent particles are in contact with each other, the particles may be connected after the binarization. In such a case, the particles are divided by, for example, segmentation. In addition, processing necessary for extraction of the particles is appropriately performed, and particles having a high aspect ratio are appropriately extracted from the original SEM image.

Hereinafter, the superconducting wire according to the embodiment will be described with reference to the drawings.

First Embodiment

A superconducting wire according to a first embodiment includes: a substrate; a first region provided on the substrate, the first region containing barium (Ba), copper (Cu), oxygen (O), and at least one first rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), and the first region extending in a first direction parallel to a surface of the substrate; a second region provided on the substrate, the second region containing barium (Ba), copper (Cu), oxygen (O), and at least one second rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), and the second region extending in a first direction along a surface of the substrate; and a third region provided on the substrate, the third region being provided so as to be in contact with the first region and the second region between the first region and the second region, the third region containing praseodymium (Pr), barium (Ba), copper (Cu), oxygen (O), and at least one third rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), and the third region extending in the first direction. In addition, a surface density of particles having an aspect ratio of 3 or more present on a surface of the third region is larger than a surface density of particles having an aspect ratio of 3 or more present on a surface of the first region, and the surface density of the particles having an aspect ratio of 3 or more present on the surface of the third region is larger than a surface density of particles having an aspect ratio of 3 or more present on a surface of the second region.

Figure 2:
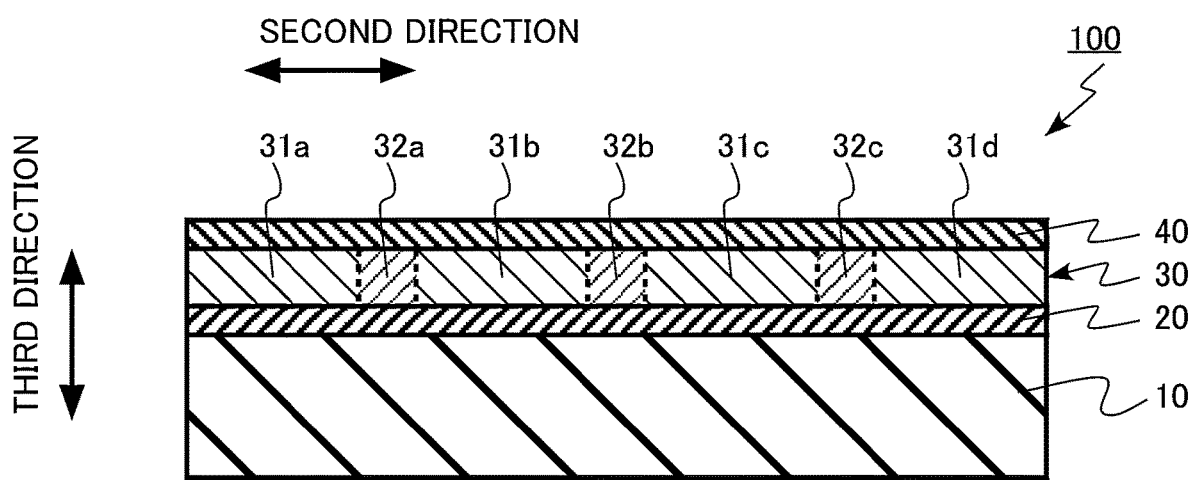
FIG. 2 is a schematic cross-sectional view of the superconducting wire according to the first embodiment.

FIG. 1 is a schematic top view of the superconducting wire according to the first embodiment. FIG. 2 is a schematic cross-sectional view of the superconducting wire according to the first embodiment. FIG. 1 is a top view of a state in which a protective layer in FIG. 2 is removed. FIG. 2 is a cross-sectional view taken along the line AA' of FIG. 1.

The superconducting wire of the first embodiment is a superconducting wire 100.

As illustrated in FIG. 2, the superconducting wire 100 includes a substrate 10, an intermediate layer 20, an oxide superconducting layer 30, and a protective layer 40. The substrate 10 increases the mechanical strength of the oxide superconducting layer 30. The intermediate layer 20 is a so-called orientation intermediate layer. The intermediate layer 20 is provided to orient the oxide superconducting layer 30 when the oxide superconducting layer 30 is formed. The protective layer 40 protects the oxide superconducting layer 30.

A length of the superconducting wire 100 in a first direction parallel to a surface of the substrate 10 is, for example, equal to or more than 0.1 m and equal to or less than 500 m.

The substrate 10 is, for example, a metal such as a nickel-tungsten alloy. In addition, the intermediate layer is, for example, yttrium oxide ($Y_2O_3$), yttria stabilized zirconia (YSZ), and cerium oxide ($CeO_2$) from the side of the substrate 10. A layer configuration of the substrate 10 and the intermediate layer 20 is, for example, nickel-tungsten alloy/yttrium oxide/yttria stabilized zirconia/cerium oxide. In this case, the oxide superconducting layer 30 is formed on cerium oxide.

The substrate 10 may be, for example, a single crystal layer lattice-matched with the oxide superconducting layer 30. The single crystal layer is, for example, lanthanum aluminate ($LaAlO_3$, hereinafter also referred to as LAO). When lanthanum aluminate is applied to the substrate 10, the intermediate layer 20 can be omitted.

For example, silver (Ag) or copper (Cu) is a metal of a base material of the protective layer 40. The protective layer 40 is, for example, an alloy. It is also possible to use an oxide layer as the protective layer 40.

The oxide superconducting layer 30 is provided between the substrate 10 and the protective layer 40. The oxide superconducting layer 30 is provided between the intermediate layer 20 and the protective layer 40. The oxide superconducting layer 30 is provided on the intermediate layer 20 in contact with the intermediate layer 20.

The oxide superconducting layer 30 includes a first superconducting region 31a, a second superconducting region 31b, a third superconducting region 31c, a fourth superconducting region 31d, a first non-superconducting region 32a, a second non-superconducting region 32b, and a third non-superconducting region 32c.

The first superconducting region 31a is an example of the first region. The second superconducting region 31b is an example of the second region. The first non-superconducting region 32a is an example of the third region.

The first superconducting region 31a, the second superconducting region 31b, the third superconducting region 31c, the fourth superconducting region 31d, the first non-superconducting region 32a, the second non-superconducting region 32b, and the third non-superconducting region 32c extend in the first direction along the surface of the substrate 10. The first direction is, for example, a longitudinal direction of the substrate 10.

The first non-superconducting region 32a is provided between the first superconducting region 31a and the second superconducting region 31b. The first non-superconducting region 32a is in contact with the first superconducting region 31a and the second superconducting region 31b.

The second non-superconducting region 32b is provided between the second superconducting region 31b and the third superconducting region 31c. The second non-superconducting region 32b is in contact with the second superconducting region 31b and the third superconducting region 31c.

The third non-superconducting region 32c is provided between the third superconducting region 31c and the fourth superconducting region 31d. The third non-superconducting region 32c is in contact with the third superconducting region 31c and the fourth superconducting region 31d.

Hereinafter, for ease of description, the first superconducting region 31a, the second superconducting region 31b, the third superconducting region 31c, and the fourth superconducting region 31d may be collectively referred to simply as a superconducting region 31. In addition, the first non-superconducting region 32a, the second non-superconducting region 32b, and the third non-superconducting region 32c may be collectively referred to simply as a non-superconducting region 32.

A second direction is perpendicular to the first direction and is a direction along the surface of the substrate 10. The second direction is a direction from the non-superconducting region 32 toward the superconducting region 31. The second direction is, for example, a lateral direction or transverse direction of the substrate 10. A direction perpendicular to the first direction and the second direction is a third direction. The third direction is a thickness direction of the substrate 10 and is substantially perpendicular to the surface of the substrate 10.

The oxide superconducting layer 30 includes the non-superconducting region 32 and the superconducting region 31. The oxide superconducting layer 30 is divided into a plurality of superconducting regions 31 with the non-superconducting region 32 interposed therebetween. In the case of FIGS. 1 and 2, the oxide superconducting layer is divided into four superconducting regions 31. The oxide superconducting layer 30 may be divided into, for example, two or three. In addition, the oxide superconducting layer 30 may be divided into, for example, five or more regions.

The superconducting region 31 has superconducting characteristics. The non-superconducting region 32 does not have superconducting characteristics. The non-superconducting region 32 electrically separates the superconducting region 31. The non-superconducting region 32 functions as an insulator when a current flows through the superconducting wire 100.

A length (L in FIG. 1) of the oxide superconducting layer 30 in the first direction is, for example, equal to or more than 0.1 m and 1 km or less. A length of the superconducting region 31 in the first direction is, for example, equal to or more than 0.1 m and 1 km or less. A length of the non-superconducting region 32 in the first direction is, for example, equal to or more than 0.1 m and 1 km or less.

A width W1 of the superconducting region 31 in the second direction is, for example, equal to or more than 5 μm and equal to or less than 10 mm. A width W2 of the non-superconducting region 32 in the second direction is, for example, equal to or more than 1 μm and equal to or less than 2 mm. For convenience, in FIG. 1, the widths of the superconducting regions 31a, 31b, 31c, and 31d are all equally expressed as W1, but actually, the widths may be different from each other. Here, a median value of the widths of the superconducting regions 31a, 31b, 31c, and 31d is expressed as W1. Similarly, in the non-superconducting regions 32a, 32b, and 32c, the widths of the non-superconducting regions 32a, 32b, and 32c may be different from each other, and the median value of the widths of the non-superconducting regions 32a, 32b, and 32c is expressed as W2.

A width (Wx in FIG. 1) of the oxide superconducting layer 30 in the second direction is, for example, equal to or more than 1 mm and equal to or less than 20 mm. A width (W2 in FIG. 1) of the non-superconducting region 32 in the second direction is, for example, equal to or less than the width (W1 in FIG. 1) of the superconducting region 31 in the second direction. The width (W2 in FIG. 1) of the non-superconducting region 32 in the second direction is, for example, smaller than the width (W1 in FIG. 1) of the superconducting region 31 in the second direction.

A boundary between the superconducting region 31 and the non-superconducting region 32 can be determined, for example, by performing mapping and point analysis on the surface of the oxide superconducting layer 30 by EPMA, and defining a region in which the concentration of praseodymium (Pr) in the rare earth element RE is less than 1% as the superconducting region 31 and a region in which the concentration of praseodymium (Pr) in the rare earth element RE is equal to or more than 1% as the non-superconducting region 32.

A thickness of the oxide superconducting layer 30 in the third direction is, for example, equal to or more than 100 nm and equal to or less than 10 μm.

The oxide superconducting layer 30 is an oxide containing a rare earth element. The oxide containing the rare earth element contained in the oxide superconducting layer 30 has a perovskite structure. The crystal of the oxide containing the rare earth element contained in the oxide superconducting layer 30 is, for example, an orthorhombic crystal.

The oxide containing the rare earth element contained in the oxide superconducting layer 30 has, for example, a chemical composition of $REBa_ACu_BO_{7-c}$ ($1.8 \leq A \leq 2.2$, $2.7 \leq B \leq 3.3$, $-0.2 \leq C \leq 1$). The oxide containing the rare earth element contained in the oxide superconducting layer 30 includes, for example, an oxide having a chemical composition of $REBa_2Cu_3O_{7-y}$ ($-0.2 \leq y \leq 1$). RE is a rare earth site.

The superconducting region 31 contains barium (Ba), copper (Cu), oxygen (O), and at least one rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu).

The concentration of praseodymium (Pr) in the rare earth element RE in the superconducting region 31 is, for example, less than 1 atom %. The concentration of praseodymium (Pr) in the superconducting region 31 is smaller than the concentration of praseodymium (Pr) in the non-superconducting region 32.

The oxide containing the rare earth element contained in the superconducting region 31 has, for example, a chemical composition of $REBa_DCu_EO_{7-F}$ ($1.8 \leq D \leq 2.2$, $2.7 \leq E \leq 3.3$, $-0.2 \leq F \leq 1$). The superconducting region 31 contains, for example, an oxide having a chemical composition of $REBa_2Cu_3O_{7-y}$ ($-0.2 \leq y \leq 1$).

The superconducting region 31 has, for example, a perovskite structure. The superconducting region 31 is, for example, a single crystal having a perovskite structure.

The superconducting region 31 is, for example, c-axis oriented. A c axis of a crystal of a compound $REBa_DCu_EO_{7-F}$ ($1.8 \leq D \leq 2.2$, $2.7 \leq E \leq 3.3$, $-0.2 \leq F \leq 1$) contained in the superconducting region 31 is aligned, for example, in the thickness direction of the oxide superconducting layer 30, that is, in a direction substantially perpendicular to the surface of the substrate 10, that is, the third direction.

The non-superconducting region 32 contains praseodymium (Pr), barium (Ba), copper (Cu), and oxygen (O), and at least one rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu).

Since the non-superconducting region 32 contains praseodymium (Pr), superconducting characteristics are not exhibited. The concentration of praseodymium (Pr) in the rare earth element RE in the non-superconducting region 32 is, for example, equal to or more than 10 atom % and equal to or less than 50 atom %. The concentration of praseodymium (Pr) in the rare earth element RE in the non-superconducting region 32 is more preferably equal to or more than 15 atom % and equal to or less than 45 atom %, and further preferably equal to or more than 20 atom % and equal to or less than 40 atom %.

The oxide containing the rare earth element contained in the non-superconducting region 32 has, for example, a chemical composition of $REBa_G CU_H O_{7-I}$ ($1.8 \leq G \leq 2.2$, $2.7 \leq H \leq 3.3$, $-0.2 \leq I \leq 1$). The non-superconducting region 32 includes, for example, an oxide having a chemical composition of $REBa_2Cu_3O_{7-y}$ ($-0.2 \leq y \leq 1$).

The non-superconducting region 32 has, for example, a perovskite structure.

At least one rare earth element selected from the group contained in each of the first superconducting region 31a, the second superconducting region 31b, the third superconducting region 31c, the fourth superconducting region 31d, the first non-superconducting region 32a, the second non-superconducting region 32b, and the third non-superconducting region 32c is, for example, the same.

For example, at least one first rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu) is contained in the first superconducting region 31a, at least one second rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu) is contained in the second superconducting region 31b, and at least one third rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu) is contained in the first non-superconducting region 32a.

For example, the first rare earth element, the second rare earth element, and the third rare earth element are the same elements. For example, the first rare earth element, the second rare earth element, and the third rare earth element are all yttrium (Y).

At least one rare earth element selected from the above group contained in each of the first superconducting region 31a, the second superconducting region 31b, the third superconducting region 31c, the fourth superconducting region 31d, the first non-superconducting region 32a, the second non-superconducting region 32b, and the third non-superconducting region 32c may be different.

For example, the first rare earth element, the second rare earth element, and the third rare earth element are different elements. For example, the first rare earth element is yttrium (Y), the second rare earth element is samarium (Sm), and the third rare earth element is dysprosium (Dy).

For example, any or all of the first rare earth element, the second rare earth element, and the third rare earth element may be two or more kinds of rare earth elements. For example, any or all of the first rare earth element, the second rare earth element, and the third rare earth element may be three or more kinds of rare earth elements.

Figure 3A:
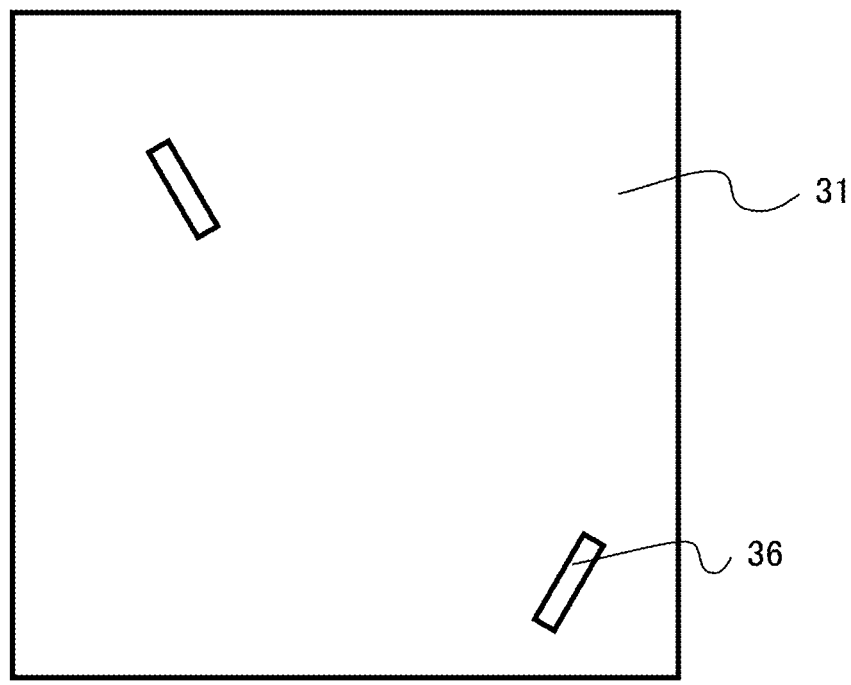
FIGS. 3A and 3B are schematic views of the superconducting wire according to the first embodiment.
Figure 3B:
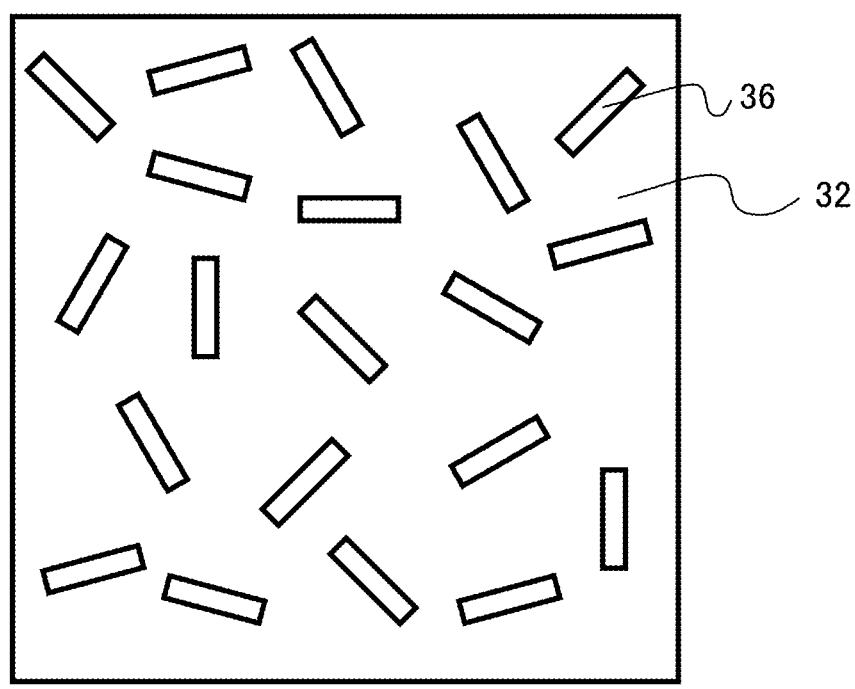

FIGS. 3A and 3B are schematic views of the superconducting wire according to the first embodiment.

FIG. 3A is a schematic view of the surface of the superconducting region 31. FIG. 3B is a schematic view of the surface of the non-superconducting region 32. FIGS. 3A and 3B are top views of a state in which the protective layer 40 on the oxide superconducting layer 30 is removed.

As illustrated in FIGS. 3A and 3B, a surface density of high-aspect-ratio particles 36 present on the surface of the non-superconducting region 32 is larger than a surface density of high-aspect-ratio particles 36 present on the surface of the superconducting region 31. The high-aspect-ratio particles 36 have an aspect ratio of 3 or more.

The high-aspect-ratio particles 36 are, for example, rod-shaped or needle-shaped particles. A long-axis direction of the high-aspect-ratio particles 36 is considered to be a c-axis direction of an oxide containing a rare earth element having an orthorhombic perovskite structure. Therefore, the high-aspect-ratio particles 36 are not c-axis oriented with respect to the surface of the substrate 10.

The larger the surface density of the high-aspect-ratio particles 36 is, the lower the degree of c-axis orientation is. Therefore, at least on the surface of the oxide superconducting layer 30, the degree of c-axis orientation of the non-superconducting region 32 is lower than the degree of c-axis orientation of the superconducting region 31.

For example, the surface density of the high-aspect-ratio particles 36 present on the surface of the first non-superconducting region 32a is larger than the surface density of the high-aspect-ratio particles 36 present on the surface of the first superconducting region 31a. In addition, for example, the surface density of the high-aspect-ratio particles 36 present on the surface of the first non-superconducting region 32a is larger than the surface density of the high-aspect-ratio particles 36 present on the surface of the second superconducting region 31b.

For example, the surface density of the high-aspect-ratio particles 36 present on the surface of the non-superconducting region 32 is 2 times or more and 1000 times or less the surface density of the high-aspect-ratio particles 36 present on the surface of the superconducting region 31. For example, the surface density of the high-aspect-ratio particles 36 present on the surface of the first non-superconducting region 32a is 2 times or more and 100 times or less the surface density of the high-aspect-ratio particles 36 present on the surface of the first superconducting region 31a. In addition, for example, the surface density of the high-aspect-ratio particles 36 present on the surface of the first non-superconducting region 32a is 2 times or more and 1000 times or less the surface density of the high-aspect-ratio particles 36 present on the surface of the second superconducting region 31b.

The surface density of the high-aspect-ratio particles 36 is the number of the high-aspect-ratio particles 36 present per unit area. The unit area in calculating the surface density of the high-aspect-ratio particles 36 is, for example, 1 µm².

When the surface density of the high-aspect-ratio particles 36 present on the surface of the superconducting region 31 or the non-superconducting region 32 is obtained, for example, the surface density is obtained by counting the number of the high-aspect-ratio particles 36 in a plurality of 10 μm square regions, and an average value thereof is used.

The surface density of the high-aspect-ratio particles 36 in the superconducting region 31 is, for example, less than 0.1 particles/μm$^2$. The surface density of the high-aspect-ratio particles 36 in the non-superconducting region 32 is, for example, equal to or more than 0.1 particles/μm$^2$ and equal to or less than 1 particle/μm$^2$.

For example, the surface density of the high-aspect-ratio particles 36 present inside the non-superconducting region 32 is smaller than the surface density of the high-aspect-ratio particles 36 present on the surface of the non-superconducting region 32. For example, the inside of the non-superconducting region 32 is a cross section along the surface of the non-superconducting region 32 at a position closer to the substrate 10 than the surface of the non-superconducting region 32. For example, the inside of the non-superconducting region 32 is a cross section at a position closer to the substrate 10 than a position of half the thickness of the non-superconducting region 32 in the third direction. The surface density of the high-aspect-ratio particles 36 present inside the non-superconducting region 32 can be measured, for example, by removing the surface of the non-superconducting region 32 by polishing or the like. The surface of the non-superconducting region 32 is, for example, the vicinity of an interface between the non-superconducting region 32 and the protective layer 40. The surface density of the high-aspect-ratio particles 36 present on the surface of the non-superconducting region 32 can be measured, for example, by removing the protective layer 40 by peeling or the like.

The oxide superconducting layer 30 may contain impurity elements that are elements other than yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), lutetium (Lu), praseodymium (Pr), barium (Ba), copper (Cu), oxygen (O), aluminum (Al), and carbon (C), for example. The impurity elements may be two or more kinds of impurity elements.

For example, an atomic concentration of the impurity element contained in the non-superconducting region 32 is higher than an atomic concentration of the impurity element contained in the superconducting region 31.

Hereinafter, an example of a method for manufacturing the superconducting wire 100 according to the first embodiment will be described.

In the example of the method for manufacturing the superconducting wire 100 according to the first embodiment, the intermediate layer 20 is formed on the substrate 10, the oxide superconducting layer 30 is formed on the intermediate layer 20, and the protective layer 40 is formed on the oxide superconducting layer 30. The oxide superconducting layer 30 is formed by a Trifluoro Acetates Metal Organic Deposition method (TFA-MOD method).

Figure 4:
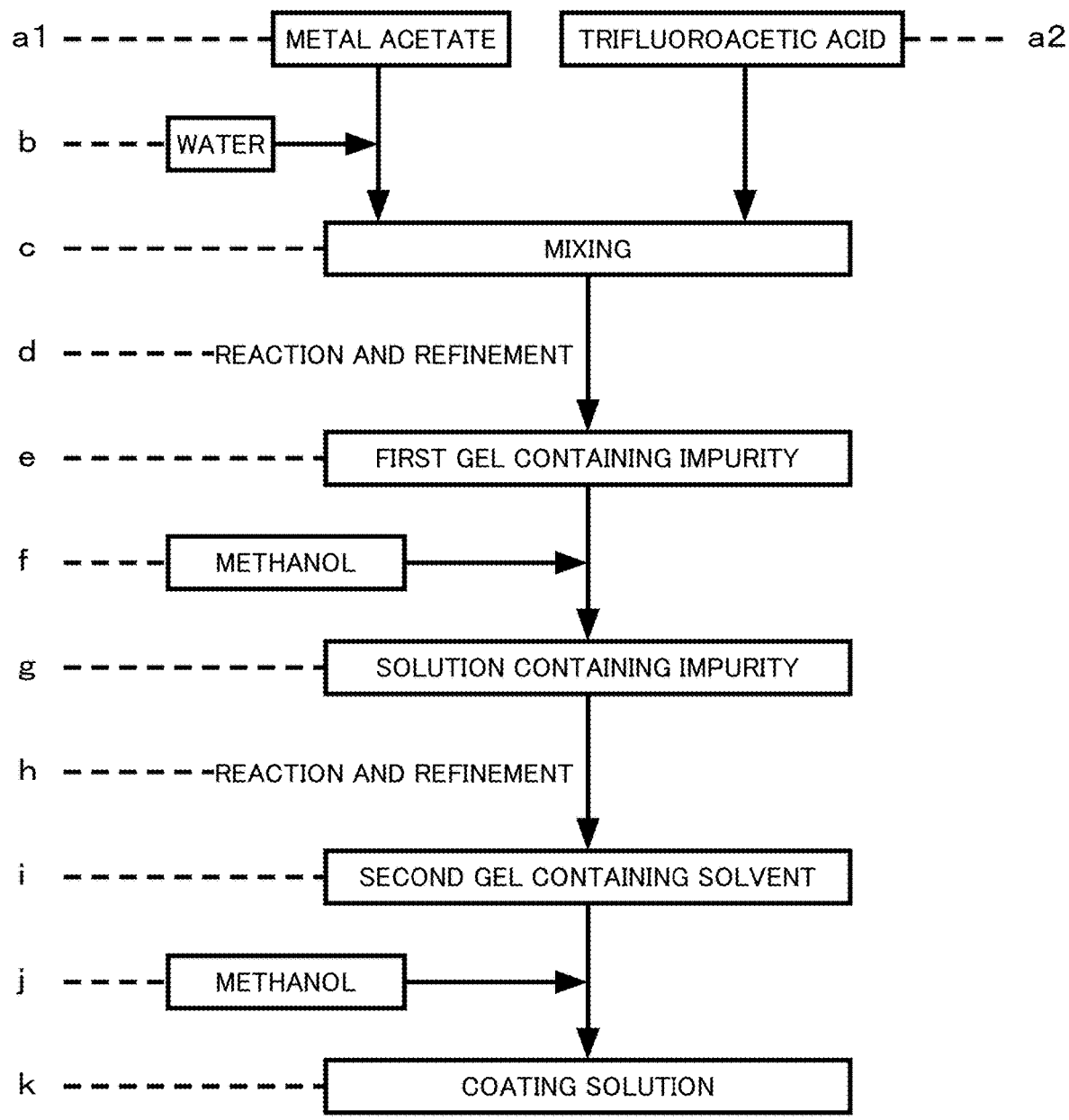
FIG. 4 is an explanatory view of a method for manufacturing the superconducting wire according to the first embodiment.

FIG. 4 is an explanatory view of the method for manufacturing the superconducting wire according to the first embodiment. FIG. 4 is a flowchart illustrating an example of preparation of a coating solution in the manufacturing method according to the first embodiment.

First, preparation of a first coating solution and a second coating solution will be described.

As illustrated in FIG. 4, metal acetates of yttrium (Y), barium (Ba), and copper (Cu) are prepared (a1). In addition, trifluoroacetic acid is prepared (a2). Next, the prepared metal acetate is dissolved in water to prepare an aqueous solution (b). The obtained aqueous solution is mixed with the prepared trifluoroacetic acid (c). The obtained solution is reacted and refined (d) to obtain a first gel containing impurities (e). After that, the obtained first gel is dissolved in methanol (f) to prepare a solution containing impurities (g). The obtained solution is reacted and refined to remove the impurities (h), thereby obtaining a second gel containing a solvent (i). In addition, the obtained second gel is dissolved in methanol (j) to prepare a coating solution (k). The method for reducing impurities by the gel including the solvent illustrated in FIG. 4 is called a Solvent-Into-Gel method (SIG method).

A coating solution containing yttrium (Y), barium (Ba), and copper (Cu) becomes the first coating solution. Hereinafter, the first coating solution is referred to as a superconducting region forming coating solution.

Next, preparation of the second coating solution will be described.

As illustrated in FIG. 4, metal acetates of praseodymium (Pr), yttrium (Y), barium (Ba), and copper (Cu) are prepared (a1). In addition, trifluoroacetic acid is prepared (a2). Next, the prepared metal acetate is dissolved in water to prepare an aqueous solution (b). The obtained aqueous solution is mixed with the prepared trifluoroacetic acid (c). The obtained solution is reacted and refined (d) to obtain a first gel containing impurities (e). After that, the obtained first gel is dissolved in methanol (f) to prepare a solution containing impurities (g). The obtained solution is reacted and refined to remove the impurities (h), thereby obtaining a second gel containing a solvent (i). In addition, the obtained second gel is dissolved in methanol (j) to prepare a coating solution (k).

The coating solution containing praseodymium (Pr), yttrium (Y), barium (Ba), and copper (Cu) becomes the second coating solution. Hereinafter, the second coating solution is referred to as a non-superconducting region forming coating solution.

Figure 5:
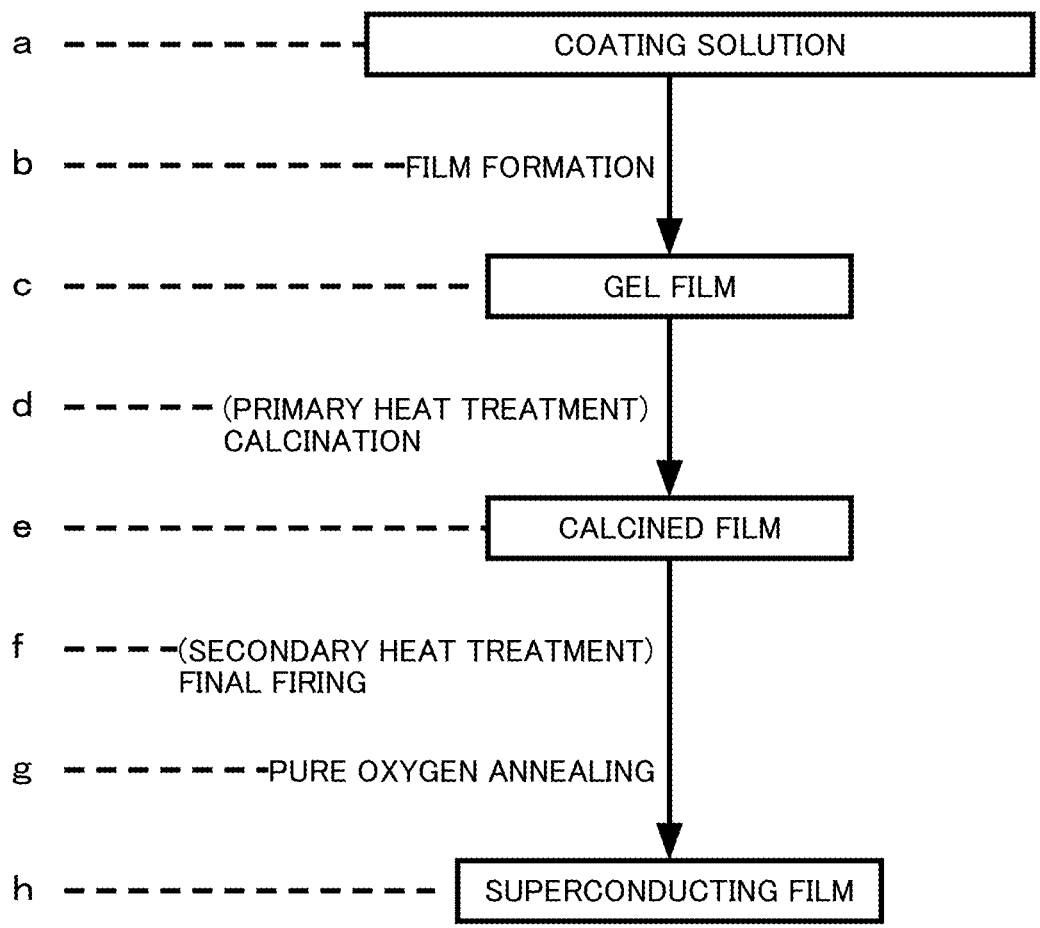
FIG. 5 is an explanatory view of the method for manufacturing the superconducting wire according to the first embodiment.

FIG. 5 is an explanatory view of the method for manufacturing the superconducting wire according to the first embodiment. FIG. 5 is a flowchart illustrating an example of a method for forming a superconducting film from a coating solution.

As illustrated in FIG. 5, first, a previously prepared coating solution is prepared (a). The coating solution is applied onto the substrate by, for example, an inkjet method to form a film (b), thereby obtaining a gel film (c). After that, the obtained gel film is subjected to calcination as a primary heat treatment to decompose an organic substance (d), thereby obtaining a calcined film (e). In addition, the calcined film is subjected to final firing as a secondary heat treatment (f), and then, for example, pure oxygen annealing is performed (g) to obtain a superconducting film (h).

Figure 6A:
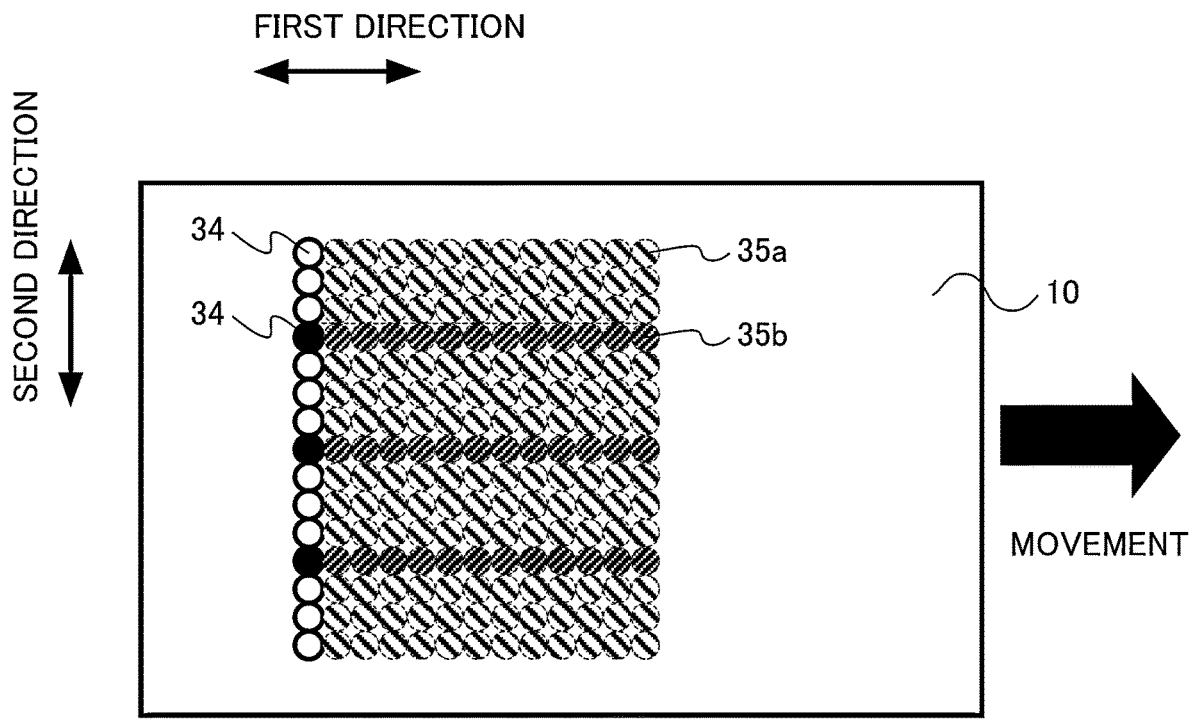
FIGS. 6A and 6B are explanatory views of the method for manufacturing the superconducting wire according to the first embodiment.
Figure 6B:
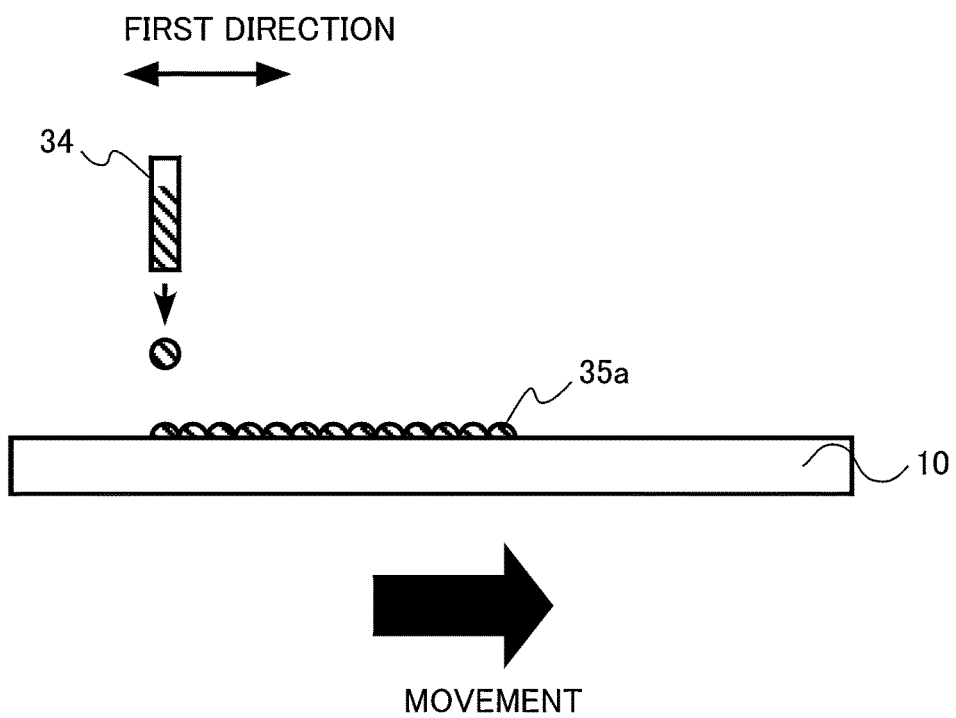

FIGS. 6A and 6B are explanatory views of the method for manufacturing the superconducting wire according to the first embodiment. FIGS. 6A and 6B are explanatory views of formation of a gel film on a substrate by an inkjet method according to the first embodiment. FIG. 6A is a view of the substrate 10 as viewed from above, and FIG. 6B is a view of the substrate 10 as viewed from a lateral direction.

As illustrated in FIGS. 6A and 6B, a superconducting region forming coating solution 35a and a non-superconducting region forming coating solution 35b are injected from nozzles 34 toward the substrate 10. As illustrated in FIG. 6A, the superconducting region forming coating solution 35a and the non-superconducting region forming coating solution 35b are injected onto the substrate 10 such that the non-superconducting region forming coating solution 35b is sandwiched between the superconducting region forming coating solutions 35a, and the superconducting region forming coating solution 35a and the non-superconducting region forming coating solution 35b are in contact with each other.

The substrate 10 moves in a first direction with respect to the nozzle 34. The superconducting region forming coating solution 35a and the non-superconducting region forming coating solution 35b injected onto the substrate 10 extend in the first direction.

An average diameter of droplets when the non-superconducting region forming coating solution 35b ejected onto the substrate 10 reaches the substrate 10 is, for example, equal to or less than 5 µm.

Instead of the inkjet method, for example, a die coating method can also be used.

Figure 7:
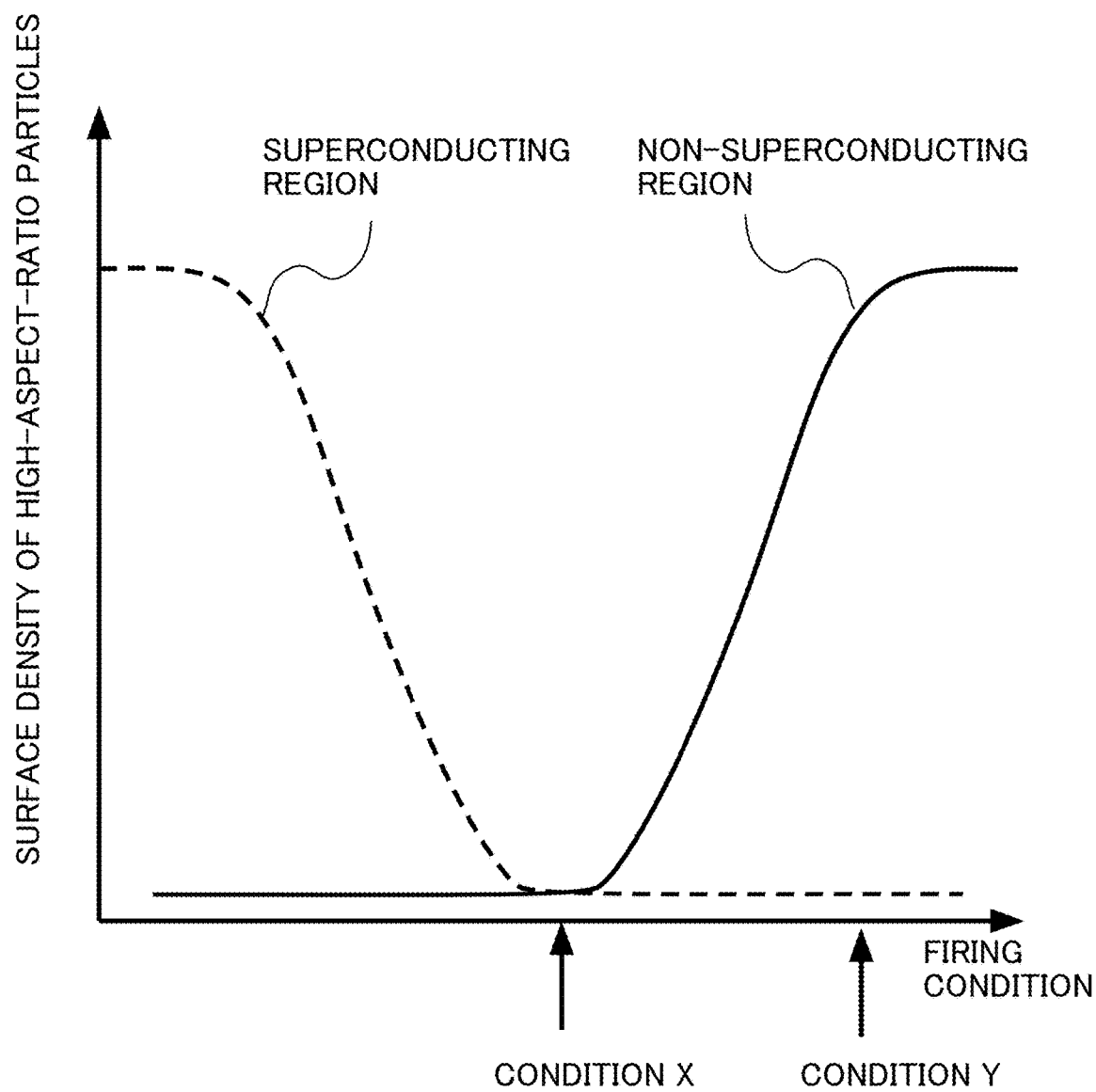
FIG. 7 is an explanatory view of the method for manufacturing the superconducting wire according to the first embodiment.

FIG. 7 is an explanatory view of the method for manufacturing the superconducting wire according to the first embodiment. FIG. 7 is an explanatory diagram of a relation between a firing condition for calcination or final firing when the superconducting wire 100 is manufactured and a surface density of the high-aspect-ratio particles 36.

As illustrated in FIG. 7, the relation between the firing condition and the surface density of the high-aspect-ratio particles 36 is different between the superconducting region 31 and the non-superconducting region 32. The firing condition is, for example, a firing temperature, a firing time, or an oxygen partial pressure.

For example, under a condition X, by setting the oxygen partial pressure during the final firing to an intermediate value between a value optimum for the superconducting region and a value optimum for the non-superconducting region, the surface density of the high-aspect-ratio particles 36 decreases in both the superconducting region 31 and the non-superconducting region 32. In other words, under the condition X, a high degree of c-axis orientation is obtained in both the superconducting region 31 and the non-superconducting region 32.

On the other hand, under a condition Y where the oxygen partial pressure during the final firing is shifted from the optimum value for the superconducting region to a slightly higher side, the oxygen partial pressure is only slightly shifted from the optimum value with respect to the superconducting region, while the shift from the optimum value with respect to the non-superconducting region is larger than that in the superconducting region. For this reason, the surface density of the high-aspect-ratio particles 36 in the superconducting region 31 is small, but the surface density of the high-aspect-ratio particles 36 in the non-superconducting region 32 is large. In other words, under the condition Y, the degree of c-axis orientation of the superconducting region 31 is high, but the degree of c-axis orientation of the non-superconducting region 32 is low.

For example, in the method for manufacturing the superconducting wire 100 according to the first embodiment, by selecting the condition corresponding to the condition Y as the firing condition, the surface density of the high-aspect-ratio particles 36 in the non-superconducting region 32 can be made larger than the surface density of the high-aspect-ratio particles 36 in the superconducting region 31. Furthermore, for example, by setting the oxygen partial pressure during the final firing to the condition X at the beginning and changing the oxygen partial pressure to the condition Y in the middle, it is possible to perform control to change the surface density of the high-aspect-ratio particles of the non-superconducting region 32 crystal-grown from the substrate side, decrease the surface density of the high-aspect-ratio particles inside the non-superconducting region 32, and increase the surface density of the high-aspect-ratio particles on the surface of the non-superconducting region 32.

The superconducting wire 100 of the first embodiment including the oxide superconducting layer 30 is manufactured by the above manufacturing method.

In the superconducting wire 100 of the first embodiment, the oxide superconducting layer 30 is divided into a plurality of superconducting regions 31 by the non-superconducting regions 32. In other words, the oxide superconducting layer 30 is thinned in the plurality of superconducting regions 31.

Therefore, according to the superconducting wire 100, an energy loss due to an inductance component can be reduced when AC application is performed. As a result, according to the superconducting wire 100, the AC loss can be reduced.

As a method for dividing the oxide superconducting layer of the superconducting wire, there is a method for performing ablation processing from above by a laser scribing method. In this method, there is a possibility that superconducting characteristics are deteriorated due to thermal damage of the laser scribing method, and mechanical strength of the oxide superconducting layer is reduced because gaps are formed between the divided oxide superconducting layers.

In the superconducting wire 100 of the first embodiment, the oxide superconducting layer 30 is divided into a plurality of superconducting regions 31 by the non-superconducting regions 32. The non-superconducting region 32 can be formed by injection or application of a coating solution. Therefore, the superconducting characteristics of the superconducting region 31 are hardly deteriorated. In addition, the non-superconducting region 32 exists between the divided superconducting regions 31. Therefore, the mechanical strength of the oxide superconducting layer 30 is improved.

In the superconducting wire 100 of the first embodiment, the surface density of the high-aspect-ratio particles 36 present on the surface of the non-superconducting region 32 is larger than the surface density of the high-aspect-ratio particles 36 present on the surface of the superconducting region 31. It is considered that the surface of the non-superconducting region 32 functions as a gettering site of impurities as the high-aspect-ratio particles 36 exist at a high density on the surface of the non-superconducting region 32. That is, the surface of the non-superconducting region 32 can function as a region that captures impurities unintentionally introduced during manufacturing of the superconducting wire 100.

For example, when the unintentionally introduced impurities enter the superconducting region 31, there is a risk of deteriorating the superconducting characteristics of the superconducting region 31. In the superconducting wire 100 of the first embodiment, the surface of the non-superconducting region 32 functions as the gettering site of the impurities, so that the impurities can be suppressed from entering the superconducting region 31. Therefore, the superconducting wire 100 having excellent superconducting characteristics can be realized.

The surface density of the high-aspect-ratio particles 36 present on the surface of the non-superconducting region 32 is preferably 2 times or more, more preferably 5 times or more, and further preferably 10 times or more the surface density of the high-aspect-ratio particles 36 present on the surface of the superconducting region 31. By exceeding the above lower limit value, capturing of the impurities on the surface of the non-superconducting region 32 is further promoted. Therefore, the superconducting wire 100 having further excellent superconducting characteristics can be realized.

From the viewpoint of promoting capturing of the impurities on the surface of the non-superconducting region 32, the surface density of the high-aspect-ratio particles 36 present inside the non-superconducting region 32 is preferably higher than the surface density of the high-aspect-ratio particles 36 present inside the superconducting region 31. For example, the inside of the superconducting region 31 is a cross section along the surface of the superconducting region 31 at a position closer to the substrate 10 than the surface of the superconducting region 31. The inside of the superconducting region 31 is, for example, a cross section closer to the substrate 10 than a position of half the thickness of the superconducting region 31 in the third direction. The surface density of the high-aspect-ratio particles 36 present inside the superconducting region 31 can be measured, for example, by removing the surface of the superconducting region 31 by polishing or the like. The surface of the superconducting region 31 is, for example, the vicinity of an interface with the protective layer 40 of the superconducting region 31. The surface density of the high-aspect-ratio particles 36 present on the surface of the superconducting region 31 can be measured, for example, by removing the protective layer 40 by peeling or the like.

On the other hand, from the viewpoint of improving the mechanical strength of the oxide superconducting layer 30, the surface density of the high-aspect-ratio particles 36 present inside the non-superconducting region 32 is preferably smaller than the surface density of the high-aspect-ratio particles 36 present on the surface of the non-superconducting region 32. The degree of c-axis orientation inside the non-superconducting region 32 is improved, and the continuity of the perovskite structure at the interface between the superconducting region 31 and the non-superconducting region 32 is improved. Therefore, the mechanical strength of the interface between the superconducting region 31 and the non-superconducting region 32 is improved.

In the superconducting wire 100 of the first embodiment, the lengths of the superconducting region 31 and the non-superconducting region 32 in the first direction are preferably equal to or more than 0.1 m from the viewpoint of causing the superconducting wire 100 to function as a wire material.

In the superconducting wire 100 of the first embodiment, from the viewpoint of reducing the AC loss, the width (W2 in FIG. 1) of the non-superconducting region 32 in the second direction is preferably smaller than the width (W1 in FIG. 1) of the superconducting region 31 in the second direction.

In the superconducting wire 100 of the first embodiment, from the viewpoint of not impairing the superconducting characteristics, the width (W1 in FIG. 1) of the superconducting region 31 in the second direction is, for example, preferably equal to or more than 5 µm and more preferably equal to or more than 10 µm.

In the superconducting wire 100 of the first embodiment, from the viewpoint of reducing the AC loss, the width (W1 in FIG. 1) of the superconducting region 31 in the second direction is, for example, preferably equal to or less than 1 mm, more preferably equal to or less than 50 µm, and further preferably equal to or less than 10 µm.

In the superconducting wire 100 of the first embodiment, from the viewpoint of ensuring the insulating property, the width (W2 in FIG. 1) of the non-superconducting region 32 in the second direction is, for example, preferably equal to or more than 5 µm and more preferably equal to or more than 10 µm.

In the superconducting wire 100 of the first embodiment, from the viewpoint of reducing the AC loss, the width (W2 in FIG. 1) of the non-superconducting region 32 in the second direction is, for example, preferably equal to or less than 1 mm, more preferably equal to or less than 50 µm, and further preferably equal to or less than 10 µm.

In the superconducting wire 100 of the first embodiment, the concentration of praseodymium (Pr) contained in the non-superconducting region 32 is preferably equal to or more than 10 atom % and more preferably equal to or more than 20 atom %, from the viewpoint of not causing the non-superconducting region 32 to exhibit superconducting characteristics.

In the superconducting wire 100 of the first embodiment, the concentration of praseodymium (Pr) contained in the superconducting region 31 is preferably less than 1 atom % and more preferably less than 0.1 atom %, from the viewpoint of not inhibiting the superconducting characteristics of the superconducting region 31.

As described above, according to the first embodiment, it is possible to provide a superconducting wire capable of reducing the AC loss. In addition, by providing the gettering site of the impurities, a superconducting wire having excellent superconducting characteristics can be provided.

Second Embodiment

A superconducting motor of a second embodiment includes a superconducting coil including a superconducting wire of the first embodiment and a superconducting magnet including the superconducting coil. Hereinafter, description of contents overlapping with those of the first embodiment may be partially omitted.

Figure 8A:
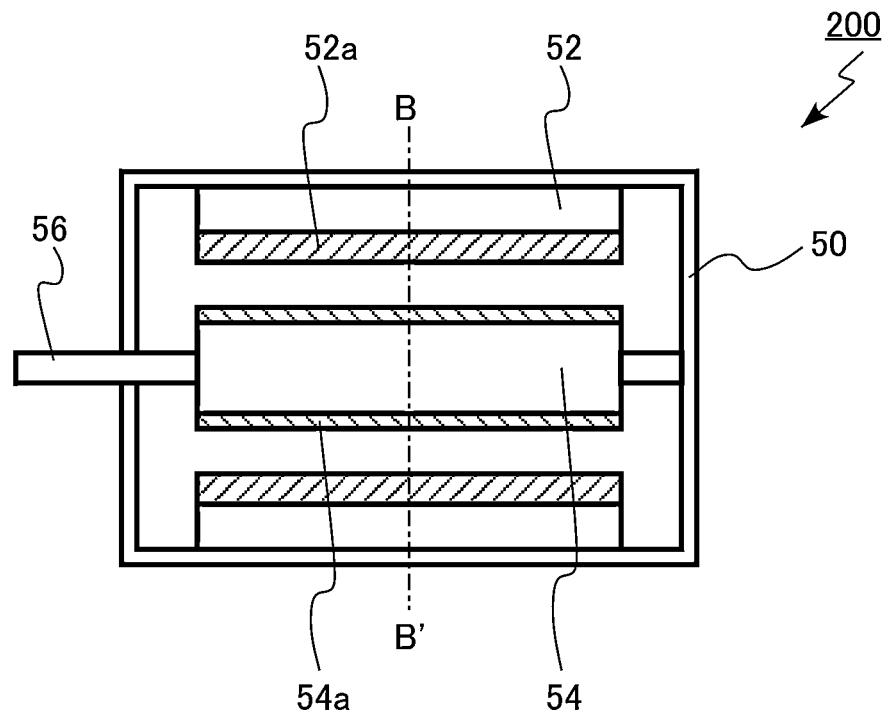
FIGS. 8A and 8B are schematic cross-sectional views of a superconducting motor according to a second embodiment.
Figure 8B:
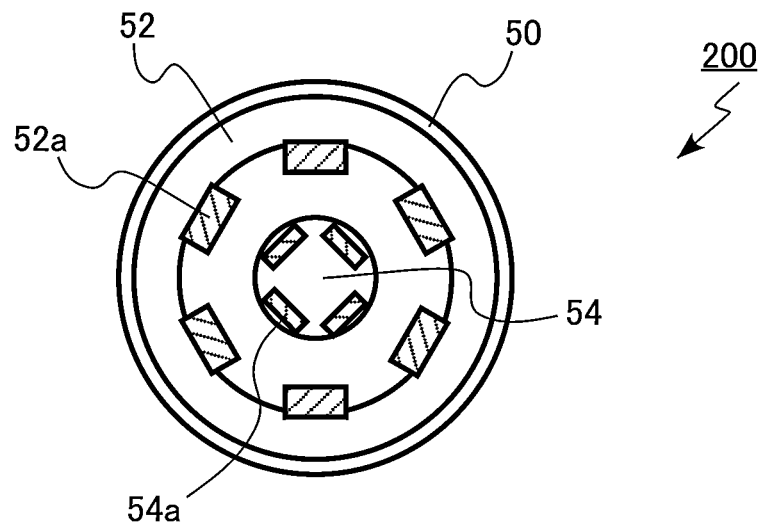

FIGS. 8A and 8B are schematic cross-sectional views of the superconducting motor according to the second embodiment. FIG. 8B illustrates a cross-section taken along the line BB' of FIG. 8A.

A superconducting motor 200 of the second embodiment is an all-superconducting motor using a superconducting coil for both a rotor and a stator.

The superconducting motor 200 includes a case 50, a stator 52, a rotor 54, and a shaft 56. The stator 52 includes a stator coil 52a, and the rotor 54 includes a rotor coil 54a.

A superconducting wire 100 of the first embodiment is used for the stator coil 52a. In addition, the superconducting wire 100 of the first embodiment is used for the rotor coil 54a. The stator coil 52a and the rotor coil 54a are examples of the superconducting coil.

An AC current flows through the stator coil 52a of the stator 52, and an AC magnetic field is generated. The stator 52 is an example of the superconducting magnet.

According to the second embodiment, it is possible to realize a superconducting coil, a superconducting magnet, and a superconducting motor in which an AC loss is reduced by using the superconducting wire 100 of the first embodiment. In addition, by using the superconducting wire 100 having excellent superconducting characteristics, a superconducting coil, a superconducting magnet, and a superconducting motor having excellent characteristics can be realized.

Third Embodiment

A superconducting aircraft of a third embodiment includes a superconducting motor of the second embodiment. Hereinafter, description of contents overlapping with those of the first and second embodiments may be partially omitted.

Figure 9:
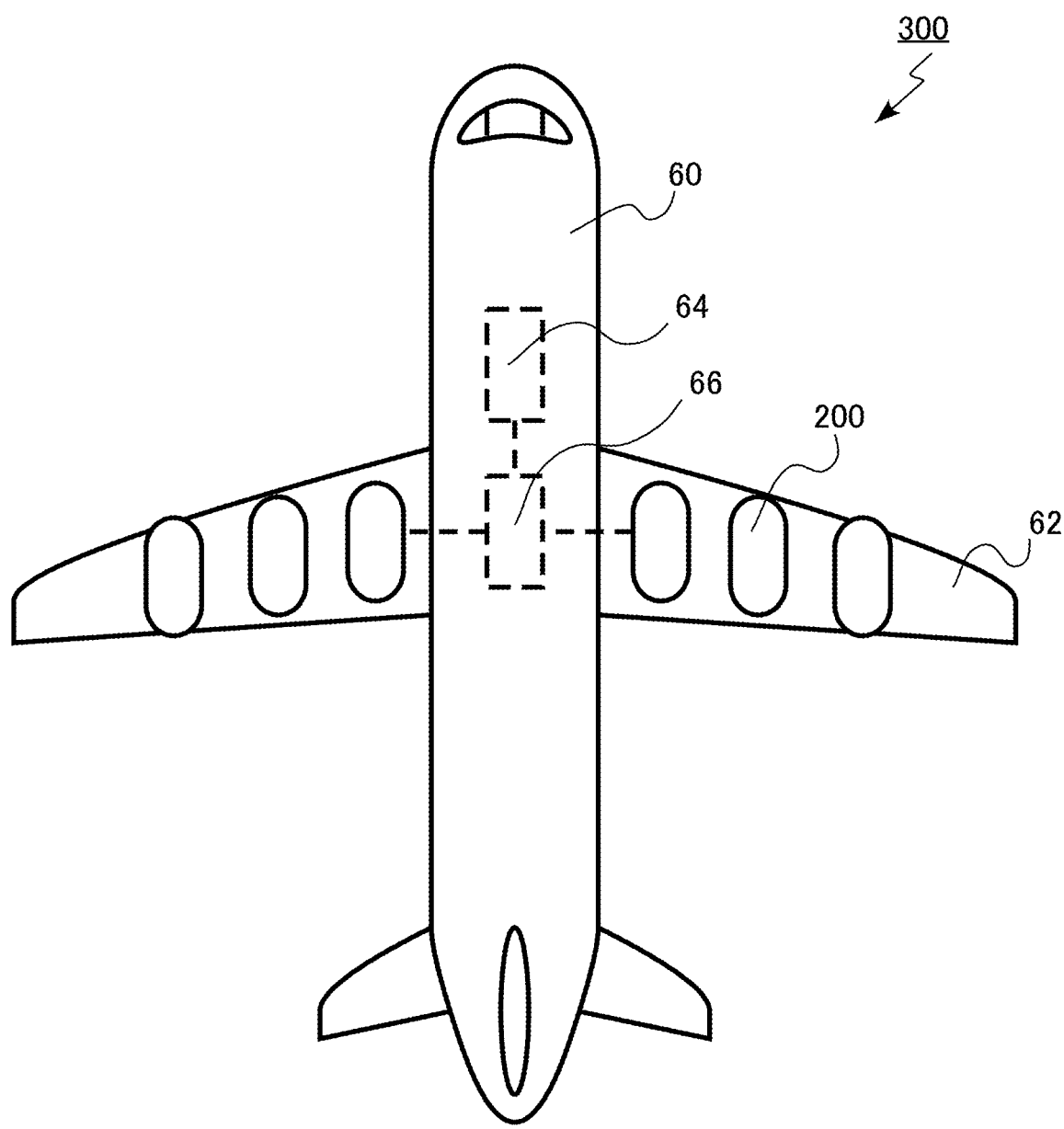
FIG. 9 is a schematic top view of a superconducting aircraft according to a third embodiment.

FIG. 9 is a schematic top view of the superconducting aircraft of the third embodiment. A superconducting aircraft 300 of the third embodiment uses a superconducting motor 200 as a power source.

The superconducting aircraft 300 includes a fuselage 60, a main wing 62, a gas turbine 64, a superconducting generator 66, and a plurality of superconducting motors 200.

The plurality of superconducting motors 200 are provided on the main wing 62. The superconducting motor 200 includes a superconducting coil using a superconducting wire 100 of the first embodiment.

A propulsion fan (not illustrated) is rotated by each of the plurality of superconducting motors 200, and a propulsive force of the superconducting aircraft 300 is generated.

The gas turbine 64 and the superconducting generator 66 are provided in the fuselage 60. The superconducting generator 66 includes a superconducting coil using the superconducting wire 100 of the first embodiment.

The gas turbine 64 is driven by using liquid hydrogen as fuel, for example. The superconducting generator 66 is directly connected to the gas turbine 64, and generates electric power by driving the gas turbine 64. The plurality of superconducting motors 200 are driven by the electric power generated by the superconducting generator 66.

According to the third embodiment, it is possible to realize a superconducting generator and a superconducting aircraft in which an AC loss is reduced by using the superconducting wire 100 of the first embodiment. In addition, by using the superconducting wire 100 having excellent superconducting characteristics, a superconducting generator and a superconducting aircraft having excellent characteristics can be realized.

Fourth Embodiment

A superconducting device of the fourth embodiment is a superconducting device including a superconducting coil using a superconducting wire of the first embodiment. Hereinafter, description of contents overlapping with those of the first embodiment will be partially omitted.

Figure 10:
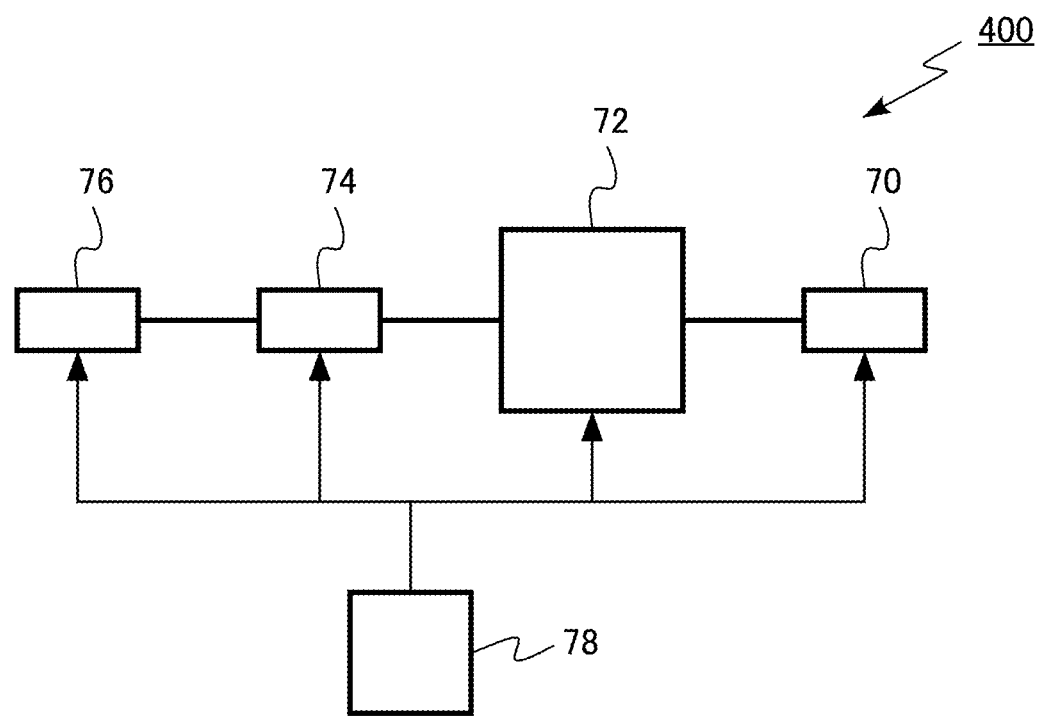
FIG. 10 is a block diagram of a superconducting device according to a fourth embodiment.

FIG. 10 is a block diagram of the superconducting device according to the fourth embodiment. The superconducting device of the fourth embodiment is a heavy particle radiotherapy device 400. The heavy particle radiotherapy device 400 is an example of the superconducting device.

The heavy particle radiotherapy device 400 includes an incidence system 70, a synchrotron accelerator 72, a beam transport system 74, an irradiation system 76, and a control system 78.

The incidence system 70 has, for example, a function of generating carbon ions to be used for treatment and performing preliminary acceleration for incidence into the synchrotron accelerator 72. The incidence system 70 includes, for example, an ion generation source and a linear accelerator.

The synchrotron accelerator 72 has a function of accelerating a carbon ion beam incident from the incidence system 70 to energy suitable for treatment. A superconducting coil using a superconducting wire 100 of the first embodiment is applied to the synchrotron accelerator 72.

The beam transport system 74 has a function of transporting the carbon ion beam incident from the synchrotron accelerator 72 to the irradiation system 76. The beam transport system 74 includes, for example, a bending electromagnet.

The irradiation system 76 has a function of irradiating a patient to be irradiated with the carbon ion beam incident from the beam transport system 74. The irradiation system 76 has, for example, a rotary gantry that enables irradiation with the carbon ion beam from an arbitrary direction. The superconducting coil using the superconducting wire 100 of the first embodiment is applied to the rotary gantry.

The control system 78 controls the incidence system 70, the synchrotron accelerator 72, the beam transport system 74, and the irradiation system 76. The control system 78 is, for example, a computer.

In the heavy particle radiotherapy device 400 according to the fourth embodiment, the superconducting coil using the superconducting wire 100 according to the first embodiment is used for the synchrotron accelerator 72 and the rotary gantry. Therefore, according to the fourth embodiment, a heavy particle radiotherapy device having excellent characteristics is realized.

In the fourth embodiment, the case of the heavy particle radiotherapy device 400 has been described as an example of the superconducting device. However, the superconducting device may be, for example, a nuclear magnetic resonance apparatus (NMR), a magnetic resonance imaging apparatus (MRI), a magnetic field application type single crystal pulling device, or a superconducting magnetic-levitation railway vehicle.

Hereinafter, examples will be described.

EXAMPLES

Example 1

A superconducting wire similar to the superconducting wire 100 of the first embodiment was manufactured according to the flowcharts illustrated in FIGS. 4 and 5. Yttrium (Y) was selected as the rare earth element in the superconducting region and the rare earth element in the non-superconducting region. The coating solution was applied onto the substrate by using an inkjet method.

As firing conditions of the gel film and the calcined film, conditions were selected in which the surface density of the high-aspect-ratio particles in the superconducting region decreases and the surface density of the high-aspect-ratio particles in the non-superconducting region increases. The firing conditions are specifically a final firing temperature of 790° C. and an oxygen partial pressure of 850 ppm.

Example 2

A superconducting wire was manufactured by a method similar to that in Example 1, except that conditions in which the surface density of the high-aspect-ratio particles in the non-superconducting region is smaller than that in Example 1 were selected as firing conditions of the gel film and the calcined film. The firing conditions are specifically a final firing temperature of 790° C. and an oxygen partial pressure of 800 ppm.

Example 3

A superconducting wire was manufactured by a method similar to that in Example 1, except that conditions in which the surface density of the high-aspect-ratio particles in the non-superconducting region is smaller than that in Example 2 were selected as firing conditions of the gel film and the calcined film. The firing conditions are specifically a final firing temperature of 790° C. and an oxygen partial pressure of 750 ppm.

Example 4

A superconducting wire was manufactured by a method similar to that in Example 1, except that gadolinium (Gd) was selected as the rare earth element in the superconducting region and the rare earth element in the non-superconducting region, and conditions in which the surface density of the high-aspect-ratio particles in the superconducting region decreases and the surface density of the high-aspect-ratio particles in the non-superconducting region increases were selected as firing conditions of the gel film and the calcined film. The firing conditions are specifically a final firing temperature of 790° C. and an oxygen partial pressure of 80 ppm.

Example 5

A superconducting wire was manufactured by a method similar to that in Example 1, except that europium (Eu) was selected as the rare earth element in the superconducting region and the rare earth element in the non-superconducting region, and conditions in which the surface density of the high-aspect-ratio particles in the superconducting region decreases and the surface density of the high-aspect-ratio particles in the non-superconducting region increases were selected as firing conditions of the gel film and the calcined film. The firing conditions are specifically a final firing temperature of 790° C. and an oxygen partial pressure of 35 ppm.

Example 6

A superconducting wire was manufactured by a method similar to that in Example 1, except that lanthanum (La) was selected as the rare earth element in the superconducting region and the rare earth element in the non-superconducting region, and conditions in which the surface density of the high-aspect-ratio particles in the superconducting region decreases and the surface density of the high-aspect-ratio particles in the non-superconducting region increases were selected as firing conditions of the gel film and the calcined film. The firing conditions are specifically a final firing temperature of 790° C. and an oxygen partial pressure of 0.2 ppm.

Example 7

A superconducting wire was manufactured by a method similar to that in Example 1, except that neodymium (Nd) was selected as the rare earth element in the superconducting region and the rare earth element in the non-superconducting region, and conditions in which the surface density of the high-aspect-ratio particles in the superconducting region decreases and the surface density of the high-aspect-ratio particles in the non-superconducting region increases were selected as firing conditions of the gel film and the calcined film. The firing conditions are specifically a final firing temperature of 790° C. and an oxygen partial pressure of 3.5 ppm.

Example 8

A superconducting wire was manufactured by a method similar to that in Example 1, except that samarium (Sm) was selected as the rare earth element in the superconducting region and the rare earth element in the non-superconducting region, and conditions in which the surface density of the high-aspect-ratio particles in the superconducting region decreases and the surface density of the high-aspect-ratio particles in the non-superconducting region increases were selected as firing conditions of the gel film and the calcined film. The firing conditions are specifically a final firing temperature of 790° C. and an oxygen partial pressure of 20 ppm.

Example 9

A superconducting wire was manufactured by a method similar to that in Example 1, except that dysprosium (Dy) was selected as the rare earth element in the superconducting region and the rare earth element in the non-superconducting region, and conditions in which the surface density of the high-aspect-ratio particles in the superconducting region decreases and the surface density of the high-aspect-ratio particles in the non-superconducting region increases were selected as firing conditions of the gel film and the calcined film. The firing conditions are specifically a final firing temperature of 790° C. and an oxygen partial pressure of 300 ppm.

Example 10

A superconducting wire was manufactured by a method similar to that in Example 1, except that holmium (Ho) was selected as the rare earth element in the superconducting region and the rare earth element in the non-superconducting region, and conditions in which the surface density of the high-aspect-ratio particles in the superconducting region decreases and the surface density of the high-aspect-ratio particles in the non-superconducting region increases were selected as firing conditions of the gel film and the calcined film. The firing conditions are specifically a final firing temperature of 790° C. and an oxygen partial pressure of 510 ppm.

Example 11

A superconducting wire was manufactured by a method similar to that in Example 1, except that erbium (Er) was selected as the rare earth element in the superconducting region and the rare earth element in the non-superconducting region, and conditions in which the surface density of the high-aspect-ratio particles in the superconducting region decreases and the surface density of the high-aspect-ratio particles in the non-superconducting region increases were selected as firing conditions of the gel film and the calcined film. The firing conditions are specifically a final firing temperature of 790° C. and an oxygen partial pressure of 920 ppm.

Example 12

A superconducting wire was manufactured by a method similar to that in Example 1, except that thulium (Tm) was selected as the rare earth element in the superconducting region and the rare earth element in the non-superconducting region, and conditions in which the surface density of the high-aspect-ratio particles in the superconducting region decreases and the surface density of the high-aspect-ratio particles in the non-superconducting region increases were selected as firing conditions of the gel film and the calcined film. The firing conditions are specifically a final firing temperature of 790° C. and an oxygen partial pressure of 1600 ppm.

Example 13

A superconducting wire was manufactured by a method similar to that in Example 1, except that ytterbium (Yb) was selected as the rare earth element in the superconducting region and the rare earth element in the non-superconducting region, and conditions in which the surface density of the high-aspect-ratio particles in the superconducting region decreases and the surface density of the high-aspect-ratio particles in the non-superconducting region increases were selected as firing conditions of the gel film and the calcined film. The firing conditions are specifically a final firing temperature of 790° C. and an oxygen partial pressure of 2000 ppm.

Example 14

A superconducting wire was manufactured by a method similar to that in Example 1, except that lutetium (Lu) was selected as the rare earth element in the superconducting region and the rare earth element in the non-superconducting region, and conditions in which the surface density of the high-aspect-ratio particles in the superconducting region decreases and the surface density of the high-aspect-ratio particles in the non-superconducting region increases were selected as firing conditions of the gel film and the calcined film. The firing conditions are specifically a final firing temperature of 790° C. and an oxygen partial pressure of 2400 ppm.

Example 15

A superconducting wire was manufactured by a method similar to that in Example 1, except that yttrium (Y) was selected as the rare earth element in the superconducting region and gadolinium (Gd) was selected as the rare earth element in the non-superconducting region, and conditions in which the surface density of the high-aspect-ratio particles in the superconducting region decreases and the surface density of the high-aspect-ratio particles in the non-superconducting region increases were selected as firing conditions of the gel film and the calcined film. The firing conditions are specifically a final firing temperature of 790° C. and an oxygen partial pressure of 760 ppm.

Example 16

A superconducting wire was manufactured by a method similar to that in Example 1, except that yttrium (Y) was selected as the rare earth element in the superconducting region and europium (Eu) was selected as the rare earth element in the non-superconducting region, and conditions in which the surface density of the high-aspect-ratio particles in the superconducting region decreases and the surface density of the high-aspect-ratio particles in the non-superconducting region increases were selected as firing conditions of the gel film and the calcined film. The firing conditions are specifically a final firing temperature of 790° C. and an oxygen partial pressure of 755 ppm.

Example 17

A superconducting wire was manufactured by a method similar to that in Example 1, except that gadolinium (Gd) was selected as the rare earth element in the superconducting region and europium (Eu) was selected as the rare earth element in the non-superconducting region, and conditions in which the surface density of the high-aspect-ratio particles in the superconducting region decreases and the surface density of the high-aspect-ratio particles in the non-superconducting region increases were selected as firing conditions of the gel film and the calcined film. The firing conditions are specifically a final firing temperature of 790° C. and an oxygen partial pressure of 80 ppm.

Comparative Example

A superconducting wire was manufactured by a method similar to that in Example 1, except that conditions in which the surface density of the high-aspect-ratio particles in the superconducting region and the surface density of the high-aspect-ratio particles in the non-superconducting region decrease similarly were selected as firing conditions of the gel film and the calcined film. The firing conditions are specifically a final firing temperature of 790° C. and an oxygen partial pressure of 700 ppm.

Table 1 shows evaluation results of the superconducting wires of Examples 1 to 17 and Comparative Example. Note that elements other than yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), lutetium (Lu), praseodymium (Pr), barium (Ba), copper (Cu), oxygen (O), aluminum (Al), and carbon (C) were counted as impurities. As a result of the EPMA measurement, in Examples 1 to 17, the surface density of the particles having an aspect ratio of 3 or more present on the surface of the non-superconducting region is larger than the surface density of the particles having an aspect ratio of 3 or more present on the surface of the superconducting region. In addition, it was found that chlorine (Cl) was segregated in the non-superconducting region. From Table 1, it can be seen that, in Examples 1 to 17, a critical current density increases as compared with Comparative Example, and superconducting characteristics are improved.

TABLE 1

|  | Rare earth element of superconducting region | Rare earth element of non-superconducting region | Surface density of high-aspect-ratio particles in superconducting region (particles/$\mu m^2$) | Surface density of high-aspect-ratio particles in non-superconducting region (particles/$\mu m^2$) | Ratio of surface density of high-aspect-ratio particles (non-superconducting region/superconducting region) | Concentration of praseodymium (Pr) in rare earth elements contained in superconducting region (atom %) |
|---|---|---|---|---|---|---|
| Example 1 | Y | Y | 0.05 | 0.68 | 12.8 | less than 0.1 |
| Example 2 | Y | Y | 0.05 | 0.24 | 4.5 | 0.1 |
| Example 3 | Y | Y | 0.05 | 0.10 | 1.9 | 0.9 |

TABLE 1-continued

| | | | | | | |
|---|---|---|---|---|---|---|
| Example 4 | Gd | Gd | 0.05 | 0.60 | 11.3 | less than 0.1 |
| Example 5 | Eu | Eu | 0.05 | 0.65 | 12.4 | less than 0.1 |
| Example 6 | La | La | 0.05 | 0.74 | 14.6 | less than 0.1 |
| Example 7 | Nd | Nd | 0.05 | 0.75 | 13.6 | less than 0.1 |
| Example 8 | Sm | Sm | 0.05 | 0.71 | 13.9 | less than 0.1 |
| Example 9 | Dy | Dy | 0.06 | 0.69 | 12.0 | less than 0.1 |
| Example 10 | Ho | Ho | 0.05 | 0.68 | 13.1 | less than 0.1 |
| Example 11 | Er | Er | 0.06 | 0.75 | 12.8 | less than 0.1 |
| Example 12 | Tm | Tm | 0.05 | 0.71 | 14.5 | less than 0.1 |
| Example 13 | Yb | Yb | 0.05 | 0.73 | 14.0 | less than 0.1 |
| Example 14 | Lu | Lu | 0.05 | 0.72 | 14.3 | less than 0.1 |
| Example 15 | Y | Gd | 0.06 | 0.68 | 11.8 | less than 0.1 |
| Example 16 | Y | Eu | 0.05 | 0.63 | 11.5 | less than 0.1 |
| Example 17 | Gd | Eu | 0.06 | 0.64 | 10.9 | less than 0.1 |
| Comparative Example 1 | Y | Y | 0.05 | 0.05 | 1 | 2 |

| | Concentration of praseodymium (Pr) in rare earth elements contained in non-superconducting region (atom %) | Impurity element | Impurity element concentration of super-conducting region (atom %) | Impurity element concentration of non-super-conducting region (atom %) | Ratio of impurity element concentrations (non-super-conducting region/super-conducting region) | Critical current density (Jc) (relative value based on Comparative Example) |
|---|---|---|---|---|---|---|
| Example 1 | 20 | Cl | 0.01 | 0.40 | 40 | 2.2 |
| Example 2 | 16 | Cl | 0.04 | 0.32 | 8 | 1.5 |
| Example 3 | 12 | Cl | 0.10 | 0.28 | 2.8 | 1.2 |
| Example 4 | 20 | Cl | 0.01 | 0.38 | 38 | 2.0 |
| Example 5 | 20 | Cl | 0.01 | 0.40 | 39 | 2.1 |
| Example 6 | 20 | Cl | 0.01 | 0.44 | 48 | 2.3 |
| Example 7 | 20 | Cl | 0.01 | 0.45 | 45 | 2.3 |
| Example 8 | 20 | Cl | 0.01 | 0.43 | 45 | 2.3 |
| Example 9 | 20 | Cl | 0.01 | 0.39 | 38 | 2.1 |
| Example 10 | 20 | Cl | 0.01 | 0.39 | 40 | 2.1 |
| Example 11 | 20 | Cl | 0.01 | 0.44 | 42 | 2.2 |
| Example 12 | 20 | Cl | 0.01 | 0.40 | 45 | 2.3 |
| Example 13 | 20 | Cl | 0.01 | 0.43 | 46 | 2.3 |
| Example 14 | 20 | Cl | 0.01 | 0.43 | 47 | 2.3 |
| Example 15 | 20 | Cl | 0.01 | 0.38 | 35 | 2.0 |
| Example 16 | 20 | Cl | 0.01 | 0.37 | 35 | 2.0 |
| Example 17 | 20 | Cl | 0.01 | 0.36 | 32 | 1.9 |
| Comparative Example 1 | 9 | Cl | 0.21 | 0.20 | 0.95 | 1 |

While certain embodiments have been described, these embodiments have been presented by way of example only, and are not intended to limit the scope of the inventions. Indeed, a superconducting wire, a superconducting coil, a superconducting magnet, a superconducting motor, a superconducting generator, a superconducting aircraft, and a superconducting device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

Hereinafter, some technical aspects of the present invention will be described in claim like clauses.

Clause 1

A superconducting wire including:
a substrate;
a first region provided on the substrate, the first region containing barium (Ba), copper (Cu), oxygen (O), and at least one first rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), and the first region extending in a first direction along a surface of the substrate;
a second region provided on the substrate, the second region containing barium (Ba), copper (Cu), oxygen (O), and at least one second rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), and the second region extending in the first direction; and
a third region provided on the substrate, the third region provided between the first region and the second region, the third region being in contact with the first region and the second region, the third region containing praseodymium (Pr), barium (Ba), copper (Cu), oxygen (O), and at least one third rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), and the third region extending in the first direction, wherein
a surface density of particles having an aspect ratio of 3 or more present on a surface of the third region is larger than a surface density of particles having an aspect ratio of 3 or more present on a surface of the first region, and
the surface density of the particles having an aspect ratio of 3 or more present on the surface of the third region is larger than a surface density of particles having an aspect ratio of 3 or more present on a surface of the second region.

Clause 2

The superconducting wire according to Clause 1, wherein a concentration of praseodymium (Pr) contained in the first region and the second region is smaller than a concentration of praseodymium (Pr) contained in the third region.

Clause 3

The superconducting wire according to Clause 1 or 2, wherein a concentration of praseodymium (Pr) in the rare earth elements contained in the first region and the second region is less than 1 atom %, and a concentration of praseodymium (Pr) in the rare earth elements contained in the third region is equal to or more than 10 atom %.

Clause 4

The superconducting wire according to any one of Clauses 1 to 3, wherein
the surface density of the particles having an aspect ratio of 3 or more present on the surface of the third region is twice or more the surface density of the particles having an aspect ratio of 3 or more present on the surface of the first region, and
the surface density of the particles having an aspect ratio of 3 or more present on the surface of the third region is twice or more the surface density of the particles having an aspect ratio of 3 or more present on the surface of the second region.

Clause 5

The superconducting wire according to any one of Clauses 1 to 4, wherein
a width of the first region in a second direction perpendicular to the first direction and along the surface of the substrate is equal to or more than 5 μm and equal to or less than 10 mm,
a width of the second region in the second direction is equal to or more than 5 μm and equal to or less than 10 mm, and
a width of the third region in the second direction is equal to or more than 1 μm and equal to or less than 2 mm.

Clause 6

The superconducting wire according to any one of Clauses 1 to 5, wherein a width of the third region in a second direction perpendicular to the first direction and along the surface of the substrate is equal to or less than a width of the first region in the second direction and a width of the second region in the second direction.

Clause 7

The superconducting wire according to any one of Clauses 1 to 6, wherein a surface density of particles having an aspect ratio of 3 or more present on a cross section along the surface of the third region at a position closer to the substrate than the surface of the third region is smaller than the surface density of the particles having an aspect ratio of 3 or more present on the surface of the third region.

Clause 8

The superconducting wire according to any one of Clauses 1 to 7, wherein
an atomic concentration of an impurity element contained in the third region is higher than an atomic concentration of an impurity element contained in the first region, and
the atomic concentration of the impurity element contained in the third region is higher than an atomic concentration of an impurity element contained in the second region.

Clause 9

A superconducting coil including the superconducting wire according to any one of Clauses 1 to 8.

Clause 10

A superconducting magnet including the superconducting coil according to Clause 9.

Clause 11

A superconducting motor including the superconducting coil according to Clause 9.

Clause 12

A superconducting generator including the superconducting coil according to Clause 9.

Clause 13

A superconducting aircraft including the superconducting motor according to Clause 11.

Clause 14

A superconducting device including the superconducting wire according to any one of Clauses 1 to 8.

What is claimed is:
1. A superconducting wire comprising:
a substrate;
a first region provided on the substrate, the first region containing barium (Ba), copper (Cu), oxygen (O), and at least one first rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), and the first region extending in a first direction along a surface of the substrate;
a second region provided on the substrate, the second region containing barium (Ba), copper (Cu), oxygen (O), and at least one second rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), and the second region extending in the first direction; and a third region provided on the substrate, the third region provided between the first region and the second region, the third region being in contact with the first region and the second region, the third region containing praseodymium (Pr), barium (Ba), copper (Cu), oxygen (O), and at least one third rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), and the third region extending in the first direction, wherein a surface density of particles having an aspect ratio of 3 or more present on a surface of the third region is larger than a surface density of particles having an aspect ratio of 3 or more present on a surface of the first region, and the surface density of the particles having an aspect ratio of 3 or more present on the surface of the third region is larger than a surface density of particles having an aspect ratio of 3 or more present on a surface of the second region.

2. The superconducting wire according to claim 1, wherein a concentration of praseodymium (Pr) contained in the first region and the second region is smaller than a concentration of praseodymium (Pr) contained in the third region.

3. The superconducting wire according to claim 1, wherein a concentration of praseodymium (Pr) in the rare earth elements contained in the first region and the second region is less than 1 atom %, and a concentration of praseodymium (Pr) in the rare earth elements contained in the third region is equal to or more than 10 atom %.

4. The superconducting wire according to claim 1, wherein the surface density of the particles having an aspect ratio of 3 or more present on the surface of the third region is twice or more the surface density of the particles having an aspect ratio of 3 or more present on the surface of the first region, and the surface density of the particles having an aspect ratio of 3 or more present on the surface of the third region is twice or more the surface density of the particles having an aspect ratio of 3 or more present on the surface of the second region.

5. The superconducting wire according to claim 1, wherein a width of the first region in a second direction perpendicular to the first direction and along the surface of the substrate is equal to or more than 5 µm and equal to or less than 10 mm, a width of the second region in the second direction is equal to or more than 5 µm and equal to or less than 10 mm, and a width of the third region in the second direction is equal to or more than 1 µm and equal to or less than 2 mm.

6. The superconducting wire according to claim 1, wherein a width of the third region in a second direction perpendicular to the first direction and along the surface of the substrate is equal to or less than a width of the first region in the second direction and a width of the second region in the second direction.

7. The superconducting wire according to claim 1, wherein a surface density of particles having an aspect ratio of 3 or more present on a cross section along the surface of the third region at a position closer to the substrate than the surface of the third region is smaller than the surface density of the particles having an aspect ratio of 3 or more present on the surface of the third region.

8. The superconducting wire according to claim 1, wherein an atomic concentration of an impurity element contained in the third region is higher than an atomic concentration of an impurity element contained in the first region, and the atomic concentration of the impurity element contained in the third region is higher than an atomic concentration of an impurity element contained in the second region.

9. A superconducting coil comprising the superconducting wire according to claim 1.

10. A superconducting magnet comprising the superconducting coil according to claim 9.

11. A superconducting motor comprising the superconducting coil according to claim 9.

12. A superconducting generator comprising the superconducting coil according to claim 9.

13. A superconducting aircraft comprising the superconducting motor according to claim 11.

14. A superconducting device comprising the superconducting wire according to claim 1.

* * * * *